(12) United States Patent
Chien et al.

(10) Patent No.: US 6,492,661 B1
(45) Date of Patent: Dec. 10, 2002

(54) LIGHT EMITTING SEMICONDUCTOR DEVICE HAVING REFLECTION LAYER STRUCTURE

(76) Inventors: Fen-Ren Chien, No. 165 Shan Ying Rd. Shan Ding Vill. Kwei Shan, Taoyuan Hsien (TW); Schang-Jing Hon, No. 165, Shan Ying Rd., Shan Ding Vill., Kwei Shan, Taoyuan Hsien (TW); Mu-Jen Lai, No. 22 Alley 6, Lane 173, Lung-Men Street, Lung-Kang Li, Chuagli City, Taoyuan Hsien (TW)

( * ) Notice: Subject to any disclaimer, the term of this patent is extended or adjusted under 35 U.S.C. 154(b) by 0 days.

(21) Appl. No.: 09/434,316

(22) Filed: Nov. 4, 1999

(Under 37 CFR 1.47)

(51) Int. Cl.$^7$ ............................. H01L 33/00; H01S 3/19
(52) U.S. Cl. ......................... 257/98; 257/103; 372/45; 372/46
(58) Field of Search ..................... 257/98, 103, 94; 372/45, 46, 50, 99

(56) References Cited

U.S. PATENT DOCUMENTS

| | | | |
|---|---|---|---|
| 5,502,316 A | 3/1996 | Kish et al. | 257/94 |
| 5,563,422 A | 10/1996 | Nakamura et al. | 257/13 |
| 5,744,829 A | 4/1998 | Murasato et al. | 257/94 |

Primary Examiner—Minh Loan Tran
(74) Attorney, Agent, or Firm—Jenkens & Gilchrist, P.C.

(57) ABSTRACT

A light-emitting device with a reflection layer is disclosed. The reflection layer is formed on a light emitting stack structure. A second substrate is subsequently combined with the reflection layer, and then the original substrate of the stack structure is removed, such that the second substrate becomes the substrate of the device. The reflection layer can effectively reflect the light emitted from the light emitting stack structure and directed to the substrate, and thus can increase the light-emitting efficiency of a surface-emitting type light-emitting device. The invention can also convert a light-emnitting device using an insulated substrate to be the one having vertical type electrode structure so as to effectively reduce the wafer area used for a die and facilitate subsequent wiring and packaging processes using traditional mechanisms.

9 Claims, 11 Drawing Sheets

LIGHT EMITTING SEMICONDUCTOR DEVICE HAVING REFLECTION LAYER STRUCTURE

FIELD OF THE INVENTION

The present invention relates to light emitting semiconductor devices and methods of producing the same. More particularly, the present invention relates to light emitting semiconductor devices having reflection layer structure and methods of producing the same.

BACKGROUND OF THE INVENTION

Figure 1:
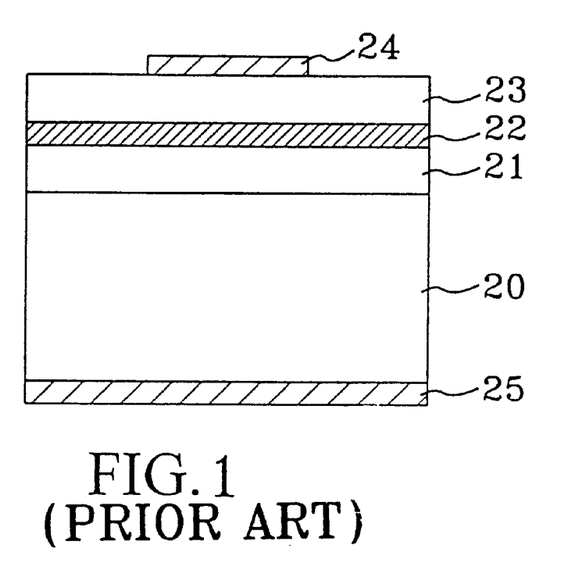
FIG. 1 is a cross-sectional view illustrating the structure of a prior surface-emitting type light-emitting device.

Conventional surface-emitting type of light-emitting devices (LED) are manufactured by using a light-absorbing substrate. FIG. 1 illustrates the structure of a prior art surface-emitting type LED, wherein a lower cladding layer 21 is formed on the light-absorbing substrate 20 first, and then an active layer 22 is formed on the lower cladding layer 21, and an upper cladding layer 23 is subsequently formed on the active layer 22, so as to form a double heterostructure. The wavelength of the light emitted from such an LED is dependent on the ratio of the composition of the active layer. The energy gap of each cladding layer is higher than that of the active layer, such that not only the carrier injection rate can be increased but also so that the light emitted from the active layer will not be absorbed by the cladding layers. Finally, a front metal electrode 24 is coated on the light-emitting surface of the LED, and a rear electrode 25 is coated on the surface of the substrate 20 opposite to the surface on which the double heterostructure is formed. Since such a vertical type LED uses a light-absorbing substrate, for example, a GaAs substrate, which can absorb the light with wavelengths from 570 nm to 650 nm, its light-emitting efficiency will be reduced. Therefore, how to overcome the light absorption problem caused by the substrate is a key to improve the light-emitting efficiency of such an LED.

Figure 2:
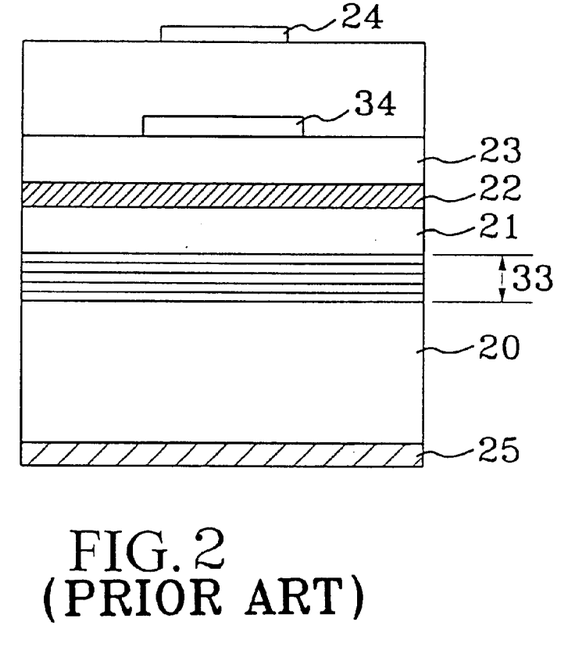
FIG. 2 is a cross-sectional view illustrating the structure of another prior surface-emitting type light-emitting device.

To overcome the shortcoming of light absorption caused by the light-absorbing substrate and to improve the light-emitting efficiency of prior art LEDs, an alternative conventional structure, as illustrated in FIG. 2, has been provided by adding a current-block region 34 and a Bragg reflector layer 33. The current-block region 34 is formed on the upper cladding layer 23 and is of the same material as that of the upper cladding layer 23 but has different doping type. The current-block region 34 can increase the current-spreading area, and thus improve the light-emnitting efficiency. The Bragg reflector layer 33 which is formed between the light-absorbing substrate 20 and the lower cladding layer 21 can reflect the light directed to the light-absorbing substrate 20 and thus increase the light-emitting efficiency. However, in such a conventional structure, a further process should be used to define the area of the current-block region 34 and double MOCVD epitaxial processes should used to form the current-block region 34. Therefore, its manufacturing process will be complicated and the manufacturing time thereof is very long. In addition, the Bragg reflector layer 33 is manufactured by iterately stacking a pair of two different layers with different refraction indexes. The range of the reflection angle of the Bragg reflector layer depends on the difference between the refraction indexes of the two layers of the pair. However, since the material of the pair is restricted to be a compound semiconductor, the difference between the refraction indexes of the two layers of the pair is very limited, and thus merely the almost vertical incident light can be reflected by the Bragg reflector layer, while other incident light can pass the Bragg reflector layer and be absorbed by the substrate. Therefore, its effect of avoiding light from being absorbed by the substrate is very limited.

Figure 3:
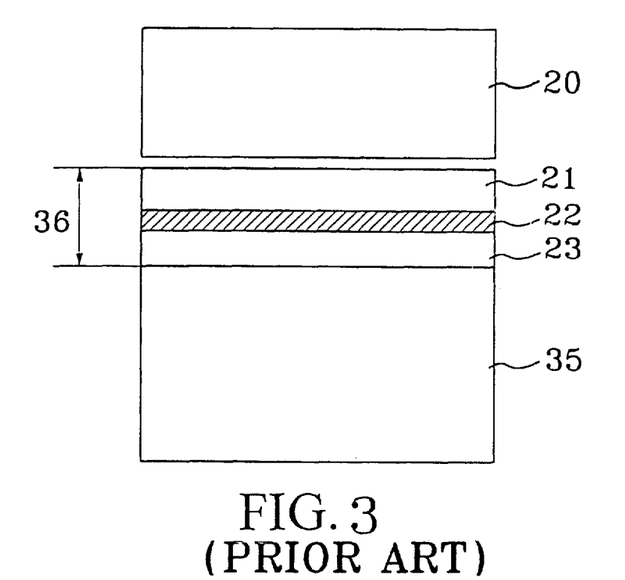
FIG. 3 is a cross-sectional view illustrating the structure of a further prior surface-emitting type light-emitting device.

Another conventional structure, as illustrated in FIG. 3, has been provided, wherein the heterostructure 36 of an LED is formed on a temporal light-absorbing substrate 20 to meet the requirement of lattice match, and after the formation of the heterostructure 36 is completed, the temporal substrate 20 is removed, and then a transparent conductive substrate 35 is attached to the heterostructure 36 by using the technique of thermal wafer bonding. The transparent conductive substrate 35 will increase the current-spreading area and will not absorb the light emitted from the active layer, and thus will increase the light-emitting efficiency. In such a conventional structure, the concept of the thermal wafer bonding technique which is used to combine the heterostructure 36 with the transparent conductive substrate 35 is that the difference between the thermal expansion coefficients of two different materials will generate a single axis press, during a thermal process, which will force the generation of the binding, caused by atom-to-atom Van der Waals' force, between the heterostructure 36 and the transparent conductive substrate 35. To achieve uniformity throughout a large area, it must generate uniform single axis press over a large area. Therefore, not only the thermal bonding machine should be specially designed, but also, that the surfaces of the transparent conductive substrate 35 and the light emitting heterostructure 36 must be of the same lattice direction so as to obtain enough bonding force and low resistance on the bonding surfaces thereof. Therefore, such a conventional method is very complicated and very difficult in manufacturing, and thus its yield rate is hard to increase.

Figure 4:
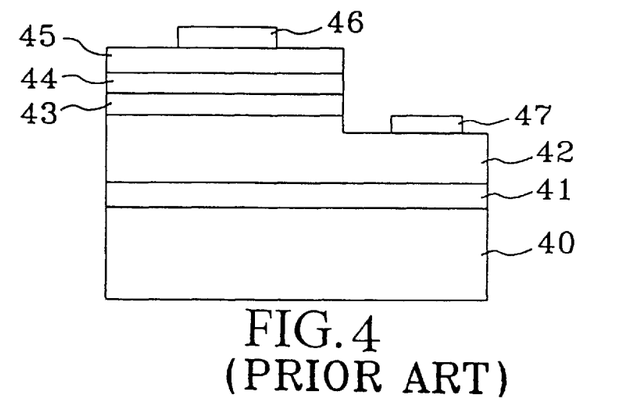
FIG. 4 is a cross-sectional view illustrating the structure of a prior surface-emitting type light-emitting device manufactured by using an insulated substrate.

Furthermore, a conventional gallium nitride-based light-emitting device using sapphire substrate must be manufactured as a lateral device, as illustrated in FIG. 4, for the reason that the sapphire substrate is insulated. Its structure comprises a sapphire substrate 40 on which a buffer layer 41, an n type lower cladding layer 42, an active layer 43, a p type upper cladding layer 44 and a p type ohmic contact layer 45 are formed serially as well as a front electrode 46 and a lateral rear electrode 47 which are formed subsequently. Silicon carbide has also been used as a substrate for a conventional gallium nitride-based light-emitting device. Although silicon carbide is conductive and the light-emitting device using silicon carbide substrate can be made to have vertical electrodes, silicon carbide is hard to manufacture and the cost thereof is very high. Conventional light-emitting devices using insulated substrates cannot be made to have traditional vertical type electrodes but must be of a lateral electrode structure. Therefore, not only special wiring mechanisms and special packaging techniques are needed, but also the area of a die is increased, so that the manufacturing process thereof will become very complicated and the cost for each unit is increased.

In view of the above, the shortcomings of prior art techniques are as follows:

1. adding a current-block region needs complicated MOCVD epitaxial processes, and the Bragg reflector layer can only reflect the light with an incident angle within a specific range;
2. the process of thermal wafer bonding to achieve uniform bonding and low resistance in the bonding interface is very complicated and difficult; and
3. gallium nitride-based light-emitting devices using sapphire substrates cannot be made to have vertical type electrodes, and thus increase the cost for each unit.

SUMMARY OF THE INVENTION

An objective of the present invention is to overcome the reduction of light-emitting efficiency by adapting a light-absorbing substrate.

Another objective of the present invention is to provide a method for easily combining a substrate with a light emitting semiconductor structure so as to reduce the complexity and difficulty of the manufacturing process and greatly increase the yield rate.

A further objective of the present invention is to simplify the manufacturing process of the current-block region and provide an effective current-spreading effect to improve light-emitting efficiency.

A still further objective of the present invention is to provide a manufacturing process which can easily convert the semiconductor light-emitting device with lateral electrode structure to be the one having a vertical type electrode structure so as to effectively reduce the area for an LED die and facilitate subsequent wiring and packaging processes using traditional mechanisms.

A light-emnitting device according to the present invention comprises a semiconductor stack structure for generating light in response to a conduction of current;

a reflection layer provided on a main surface of the semiconductor stack structure for reflecting light generated from the stack structure and directed to the reflection layer;

a thick layer positioned above the reflection layer and functioning as a substrate; and electrode structure for applying a current to the semiconductor stack structure.

The reflection layer may comprises at least one area with inferior conductivity functioned as a current-block region.

In addition, according to the present invention, a method for manufacturing a light-emitting device comprises the steps of:

forming on a first substrate a first conductive type lower cladding layer;

forming a second conductive type upper cladding layer adjacent to the lower cladding layer;

forming an ohmic contact layer above the upper cladding layer;

forming a reflection layer on the ohmic contact layer;

combining a second substrate with the reflection layer;

removing the first substrate; and forming electrodes which are electrically coupled to the lower cladding layer and the upper cladding layer respectively.

In the light-emitting device according the present invention, the light-absorbing substrate has been removed during the manufacturing process, and thus totally overcome the problem of reduction of light-emitting efficiency caused by using a light-absorbing substrate. Further, the light-emitting device, according to the present invention, has a reflection layer which can effectively reflect the light directed to the substrate, and thus can improve the light-emitting efficiency of a surface-emitting type LED. The reflection layer of the present invention can comprise a single metal layer or multiple metal layers which can function as an intervention layer for facilitating the combination of the second substrate and the light emitting semiconductor structure. Therefore, not only the difficulties of conventional thermal wafer bonding can be avoided, but also the limitation to the choice of the material of the second substrate can be lessened. Moreover, in the light-emitting device, according to the present invention, the current-block region can be formed during the process of forming the reflection layer, and thus greatly simplify the manufacturing process of the current-block region.

In addition, the method of the present invention can be directly used to make a light-emitting device which originally utilized an insulated substrate to be one of having a vertical type electrode structure. Therefore, not only the wafer area used for a die can be effectively reduced, but also the final stage of the manufacturing can use the traditional wiring and packaging process. Further, it can provide a cleavage to divide the dies from each other, and thus it is suitable for making a laser diode.

BRIEF DESCRIPTION OF THE DRAWINGS

Other aspects and advantages of the present invention will become apparent from the following descriptions taken in conjunction with the accompanying drawings, wherein.

DETAIL DESCRIPTION OF THE INVENTION

A light-emitting device according to the present invention can be of the following advantages:

1. A reflection layer is added between the light emitting heterostructure and the conductive substrate. In addition, a current-block region can be provided during the manufacturing process of the reflection layer. Therefore, it does not need to manufacture the current-block region by using two more MOCVD epitaxial processes, and thus reduce the complexity and cost of the manufacturing process. Besides, incident light can only penetrate the surface of the reflection layer and will be reflected by dipoles in the reflection layer, and metal can reflect the light with any incident angle. Therefore, the reflection layer can provide an effective reflection of light to prevent the light from being absorbed by the substrate.

2. Since metal and compound semiconductors easily form an alloy bonding, the reflection layer can be used as an intervention layer for the combination of the light emitting heterostructure and the substrate, and thus the process of the combination is much easier and simpler than that of thermal wafer bonding.

3. The process of adding a reflection layer between the heterostructure of a light-emitting device using an insulated substrate and another substrate and then removing the insulated substrate can manufacture a gallium nitride-based light-emitting device having vertical type electrode structure which can facilitate the process of wiring and packaging of a die and can reduce the wafer area used for a die so as to reduce the cost.

Reference now will be made in detail to the preferred embodiments of the present invention as illustrated in the accompanying drawings in which like reference numerals designate like or corresponding elements throughout the drawings. For the purposes of explanation, specific details are set forth to provide a thorough understanding of the present invention. However, it will be understood by one skilled in the art that the present invention may be practiced without these details.

Figure 5:
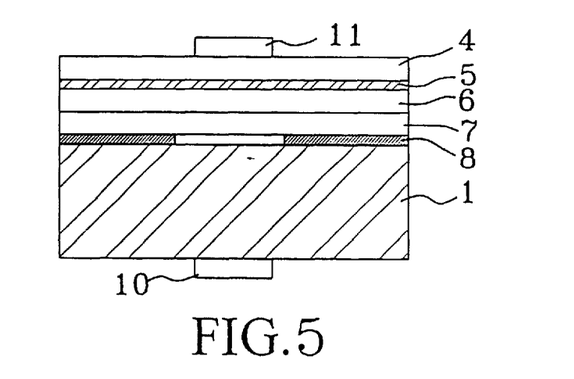
FIG. 5 is a cross-sectional view illustrating the structure of a surface-emitting type light-emitting device implemented according to the present invention.

FIG. 5 illustrates the structure of a surface-emitting type light-emitting device according to the present invention which comprises a metal reflection layer 8, a ohmic contact layer 7, an upper cladding layer 6, an active layer 5, a lower cladding layer 4, a front electrode 11 and rear electrode 10.

The features, methods and objects of the present invention can be easily understood from the description of following embodiments:

Embodiment 1

Figure 6A:
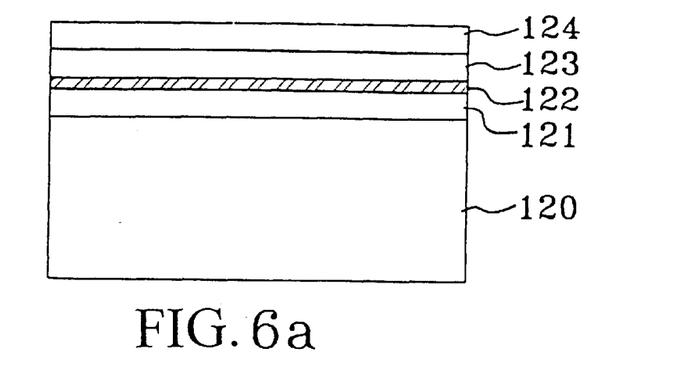
FIGS. 6a–6g are schematic views illustrating the manufacturing process of a surface-emitting type light-emitting device according to an embodiment of the present invention.
Figure 6B:
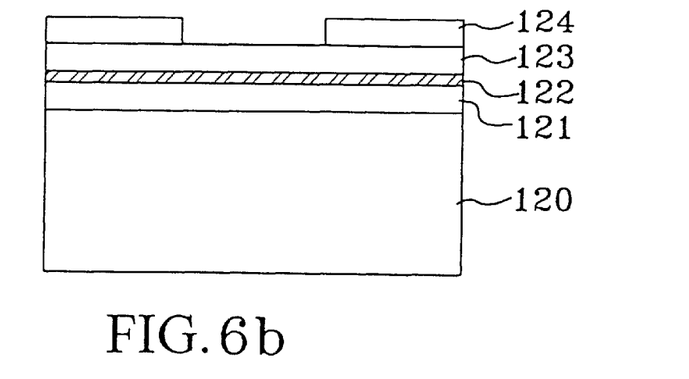
Figure 6C:
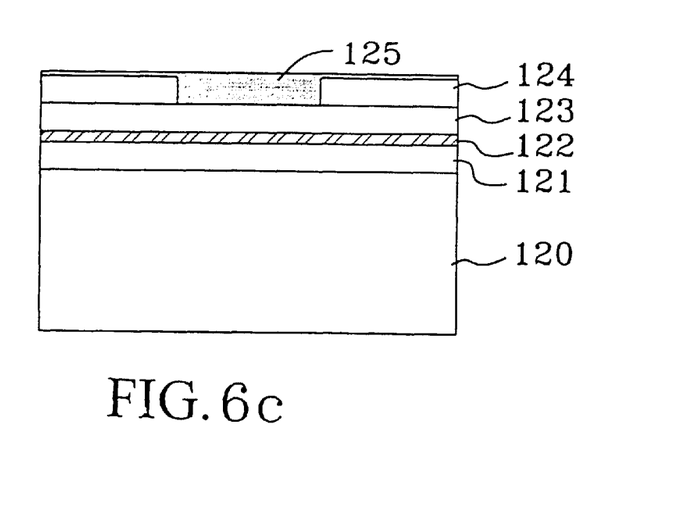
Figure 6D:
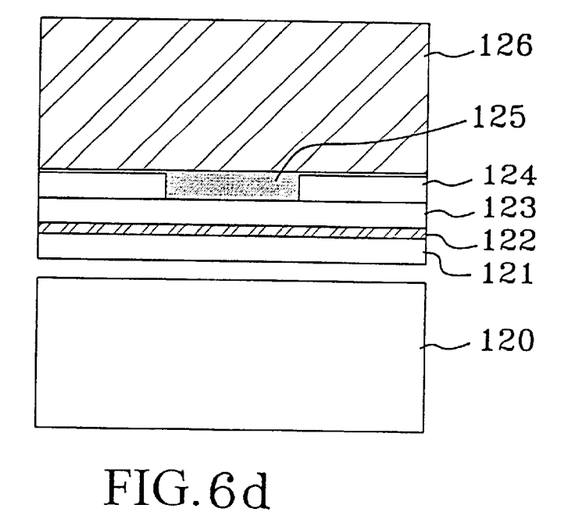
Figure 6E:
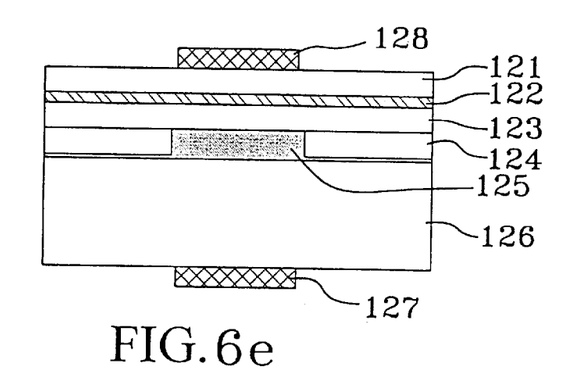

Please refer to FIG. 6a. In an embodiment of the present invention, on a first n type GaAs substrate 120, there are serially epitaxially formed an n type AlGaInP lower cladding layer 121, a AlGahiP active layer 122 which is of a conventional structure and can be of a single-quantum-well structure (SQW) or a multiple-quantum-well structure (MQW), a p type AlGaInP upper cladding layer 123 and an ohmic contact layer 124 which consists of a p type InGaP layer and a p type GaAs layer. After the epitaxial process is finished, part of the p type ohmic contact layer 124 is removed by using an etching technique so as to expose the p type upper cladding layer 123 as illustrated in FIG. 6b. A metal reflection layer 125 is subsequently coated over the p type ohmic contact layer 124 and the p type upper cladding layer 123 by using a coating technique or sputtering technique as illustrated in FIG. 6c. A p type conductive substrate 126 serving as a second substrate is thermally combined with the metal reflection layer 125, and then the first n type GaAs substrate 120 is removed as illustrated in FIG. 6d. Subsequently, a front metal electrode 128 and a rear metal electrode 127 are manufactured as illustrated in FIG. 6e.

Reflection layer 125 can form effective ohmic contact with the p type ohmic contact layer 124, but forms Schottky contact with the p type upper cladding layer 123. The metal ohmic contact has very good conductivity, and can not only function as a current-spreading path but also can effectively reflect the light emitted from the active layer 122 since the metal reflection layer 125 can reflect light with any incident angle. The Schottky contact has poor conductivity, and functions as a current-block region. However, the Schottky contact area can also reflect the light emitted from the active layer 122.

Figure 6F:
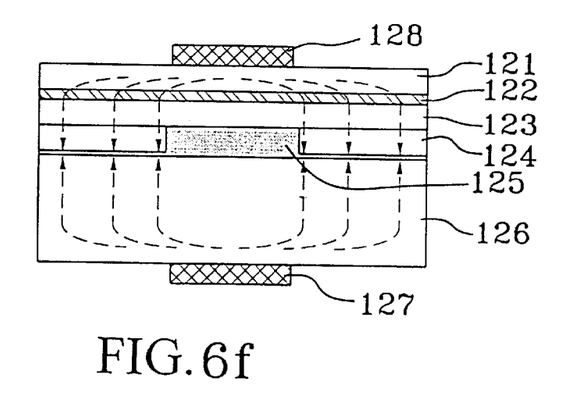

FIG. 6f shows the distribution of the input current in the light-emitting device of this embodiment. The metal reflection layer 125 can effectively spread the current and thus improve the light-emitting efficiency.

Figure 6G:
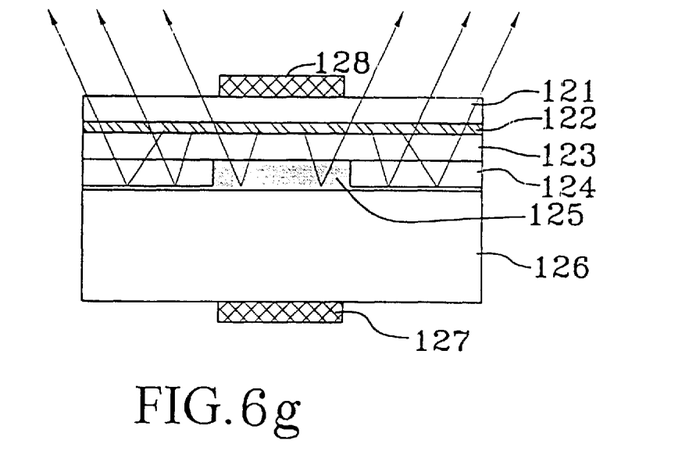

FIG. 6g shows how the metal reflection layer 125 reflects the light emitted from the active layer 122 to prevent the light form being absorbed by the substrate 126, so as to improve the light-emitting efficiency.

Embodiment 2

Figure 7A:
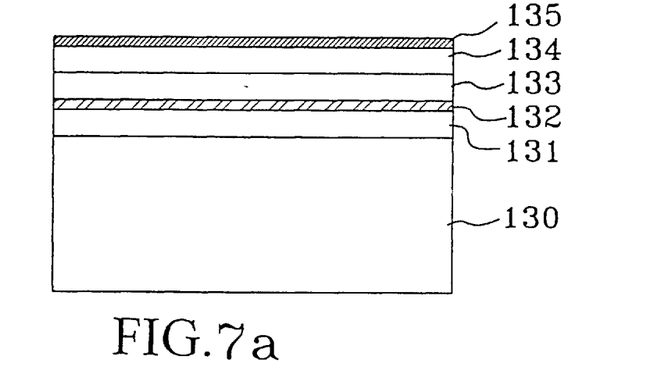
FIGS. 7a–7d are schematic views illustrating the manufacturing process of a surface-emitting type light-emitting device according to another embodiment of the present invention.
Figure 7B:
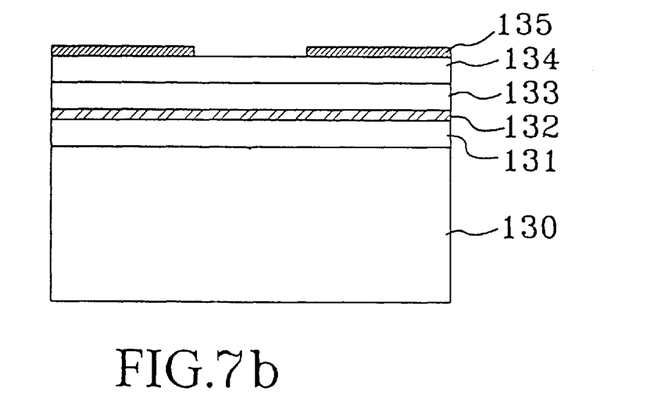
Figure 7C:
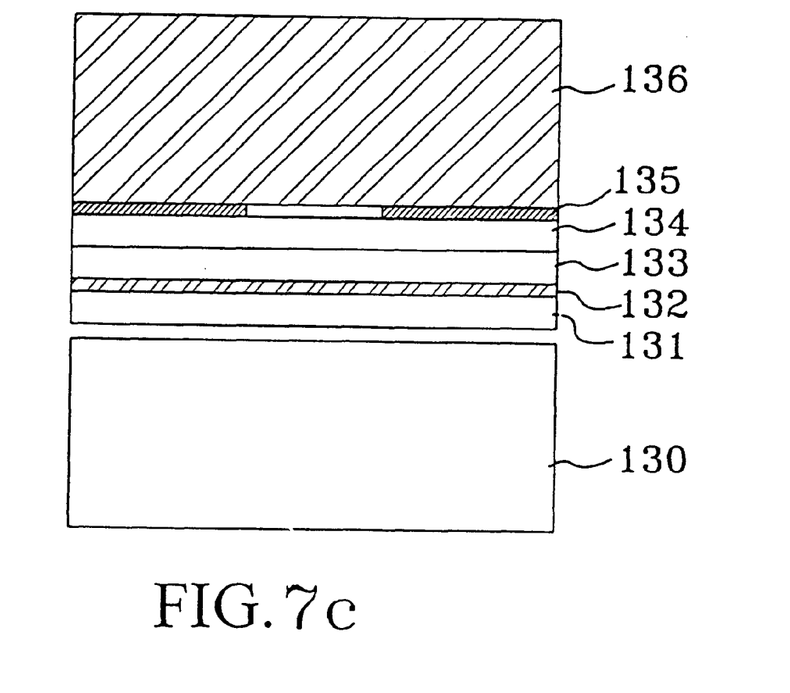
Figure 7D:
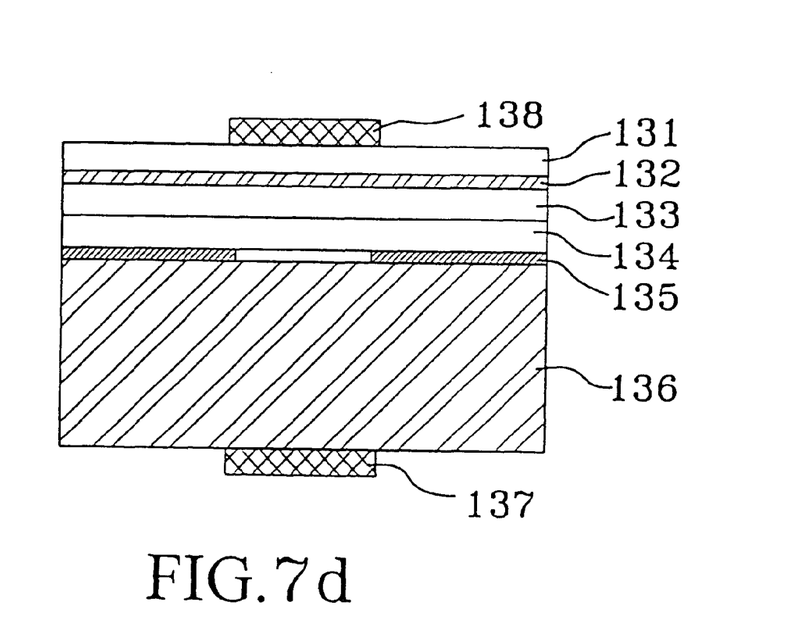

Referring to FIG. 7a, in another embodiment of the present invention, on a first n type GaAs substrate 130, there are serially epitaxially formed an n type AlGaInP lower cladding layer 131, a AlGaInP active layer 132 which is of a conventional structure and can be of a single-quantum-well structure (SQW) or a multiple-quantum-well structure (MQW), a p type AlGaInP upper cladding layer 133 and a p type ohmic contact layer 134. After the epitaxial process is finished, a metal reflection layer 135 is subsequently coated over the p type ohmic contact layer 134 by using a coating technique or sputtering technique, and then part of the p type reflection layer 135 is removed by using an etching technique so as to expose the p type ohmic contact layer 134 as illustrated in FIG. 7b. A p type conductive substrate 136 serving as a second substrate is thermally combined with the metal reflection layer 135, and then the first n type GaAs substrate 130 is removed as illustrated in FIG. 7c. Finally, a front metal electrode 138 and a rear metal electrode 137 are manufactured as illustrated in FIG. 7d.

The metal reflection layer 135 can form effective ohmic contact with the p type ohmic contact layer 134. The function of the ohmic contact is the same as that described in Embodiment 1. The gap between the exposed p type ohmic contact layer 134 and the p type second substrate 136 can function as a current-block region. The refraction index (n) of the AlGaInP upper cladding layer 133 is about 3.5, while the refraction index of the gap between the exposed p type ohmic contact layer 134 and the p type second substrate 136 is about 1. Therefore, the light emitted from the active layer 132 and directed to the gap between the exposed p type ohmic contact layer 134 and the p type second substrate 136 will pass from a medium with a bigger refraction index to a medium with a smaller refraction index, and thus the gap can also reflect the light. The current distribution and the reflection of the light emitted from the active layer of this embodiment are the same as that of the Embodiment 1.

Embodiment 3

Figure 8A:
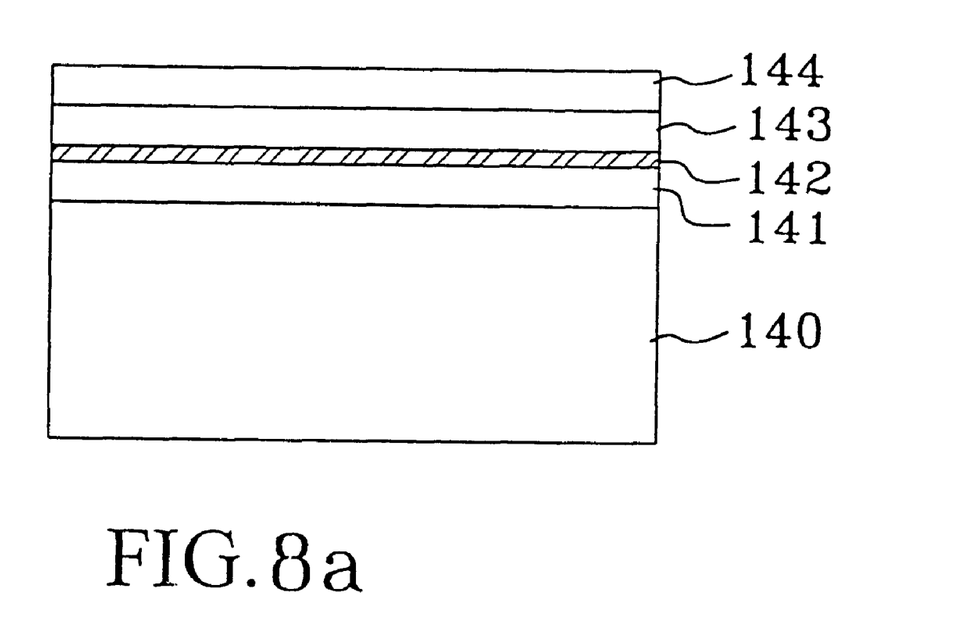
FIGS. 8a–8d are schematic views illustrating the manufacturing process of a surface-emitting type light-emitting device according to a further embodiment of the present invention.
Figure 8B:
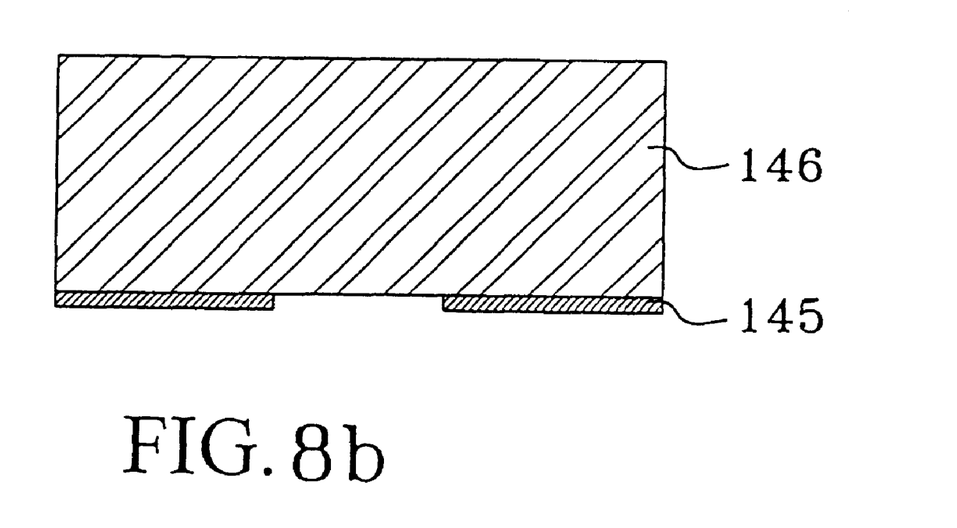
Figure 8C:
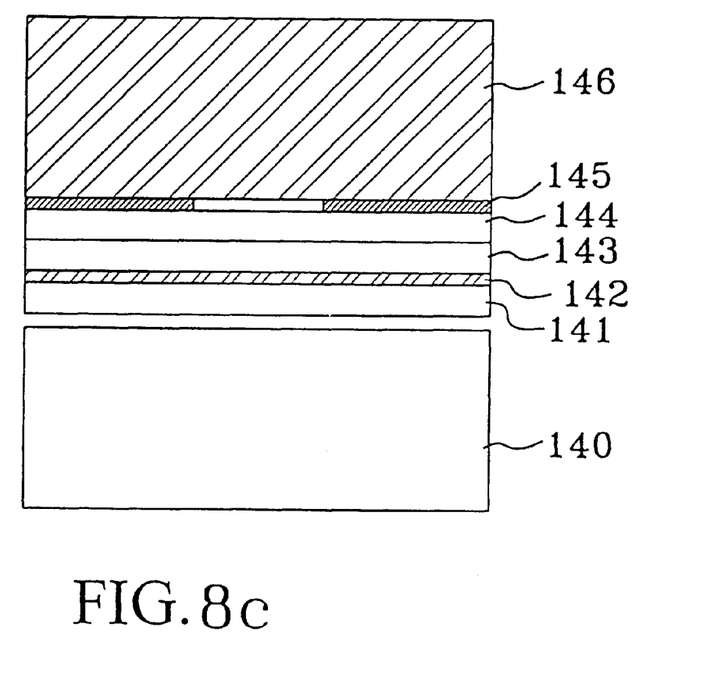
Figure 8D:
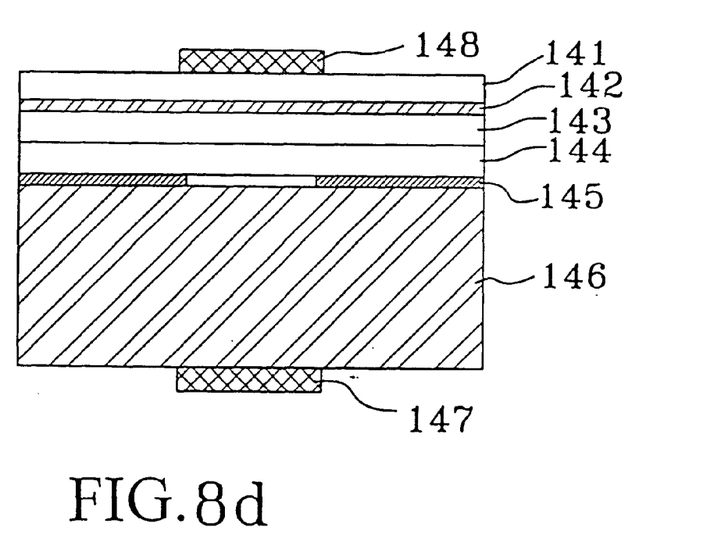

Referring to FIG. 8a, in a further embodiment of the present invention, on a first n type GaAs substrate 140, there are serially epitaxially formed an n type AlGaInP lower cladding layer 141, a AlGaInP active layer 142 which is of a conventional structure and can be of a single-quantum-well structure (SQW) or a multiple-quantum-well structure (MQW), a p type AlGaInP upper cladding layer 143 and a p type ohmic contact layer 144. After the epitaxial process is finished, a metal reflection layer 145 is coated on a p type second substrate 146 by using a coating technique or sputtering technique, and then part of the metal reflection layer 145 is removed so as to expose the p type second substrate 146, as illustrated in FIG. 8b. Subsequently, the metal reflection layer 145 is thermally combined with the ohmic contact layer 144, and then the first n type GaAs substrate 140 is removed, as illustrated in FIG. 8c. Finally, a front metal electrode 148 and a rear metal electrode 147 are manufactured as illustrated in FIG. 8d.

The metal reflection layer 145 can form effective ohmic contact with the p type ohmic contact layer 144. The function of the ohmic contact and the function of the gap between the exposed p type second substrate 146 and the ohmic contact layer 144 are the same as that described in Embodiment 2.

The current distribution and the reflection of the light emitted from the active layer of this embodiment are the same as that of the Embodiment 1.

Embodiment 4

Figure 9A:
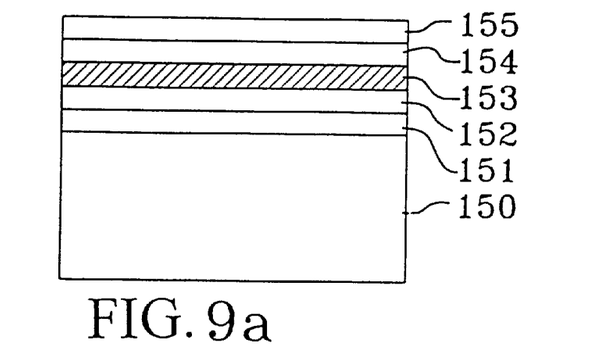
FIGS. 9a–9e are schematic views illustrating the manufacturing process of a surface-emitting type light-emitting device using an insulated substrate according to an embodiment of the present invention.
Figure 9B:
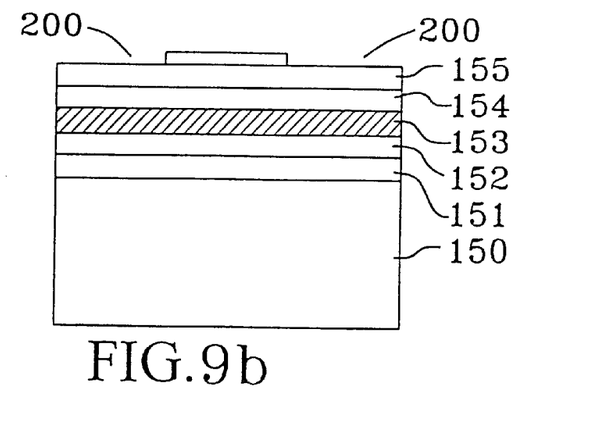
Figure 9C:
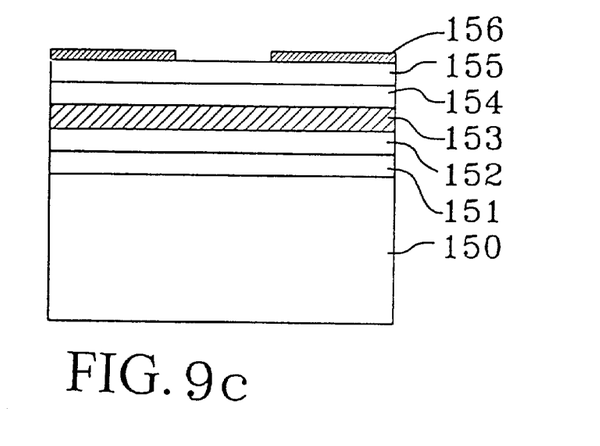
Figure 9D:
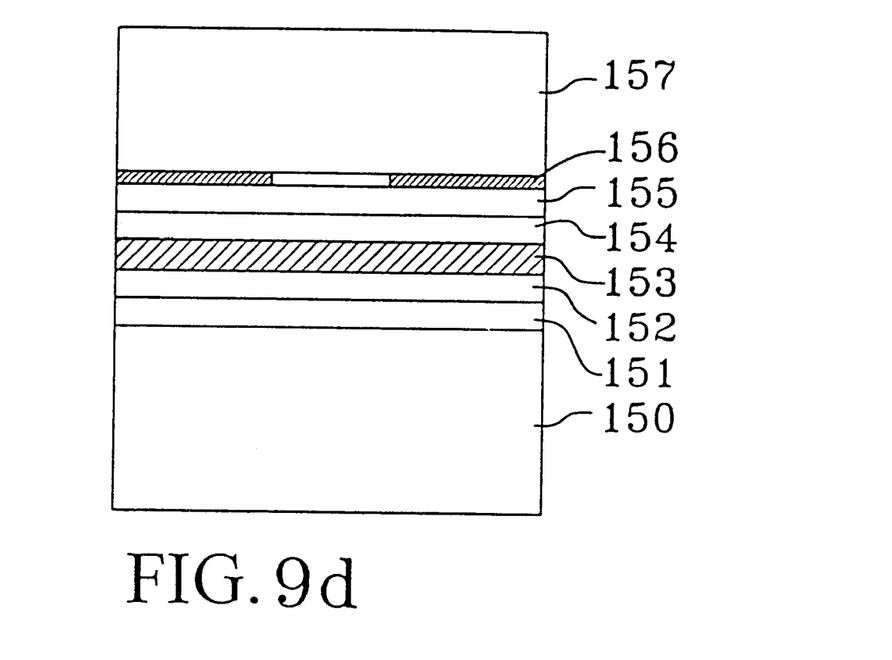
Figure 9E:
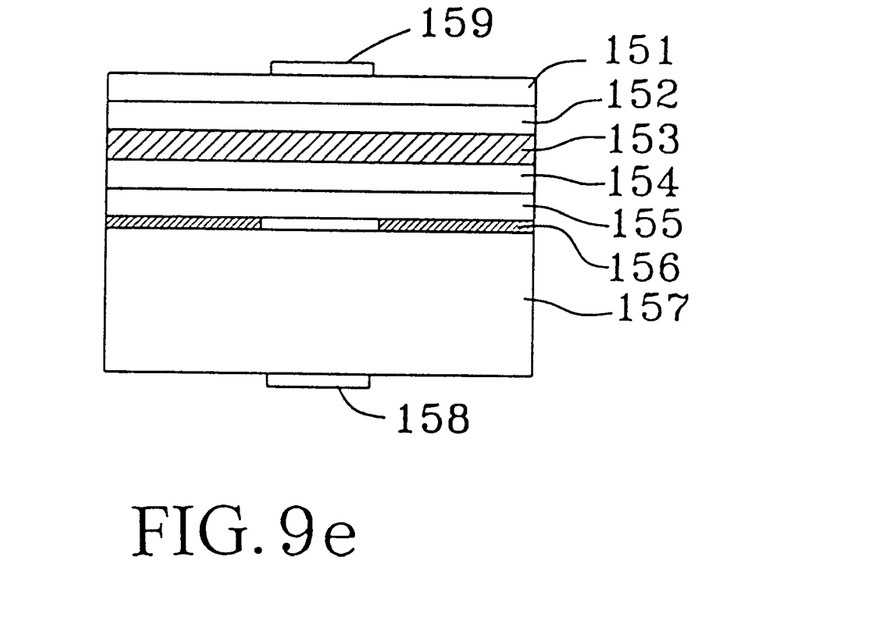

Referring to FIG. 9a, in this embodiment, on a first insulated sapphire substrate 150, there are serially epitaxially formed an n type GaN buffer layer 151, an n type AlGaN lower cladding layer 152, an InGaN active layer 153 which is of a conventional structure and can be of a single-quantum-well structure or a multiple-quantum-well structure, a p type AlGaN upper cladding layer 154 and a p type GaN ohmic contact layer 155. After the epitaxial process is finished, a coating pattern 200 is formed on the p type ohmic contact layer 155 by a photo-lithographic process, as illustrated in FIG. 9b. Subsequently, a metal reflection layer 156 is coated on the coating pattern 200 which is on the p type ohmic contact layer 155 by using a coating technique or sputtering technique, as illustrated in FIG. 9c. Then, a p type second substrate 157 is thermally combined with the metal reflection layer 156, followed by removing the first sapphire substrate 150, as illustrated in FIG. 9d. Finally, a front metal electrode 159 and a rear metal electrode 158 are manufactured, and thus a gallium nitride-based light-emitting device with vertical type electrode structure is manufactured, as illustrated in FIG. 9e.

The metal reflection layer 156 can form effective ohmic contact with the p type ohmic contact layer 155. The function of the ohmic contact and the function of the exposed gap between the p type second substrate 157 and the ohmic contact layer 155 are the same as that described in Embodiment 2.

The current distribution and the reflection of the light emitted from the active layer of this embodiment are the same as that of the Embodiment 1.

Embodiment 5

Figure 10A:
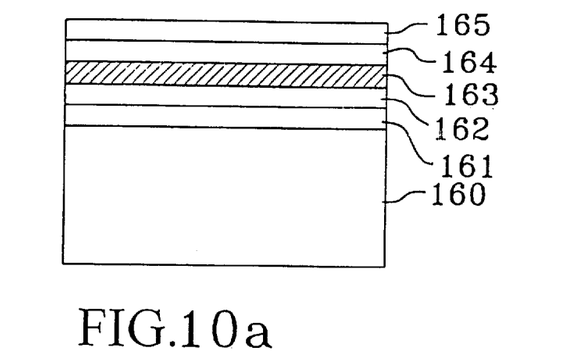
FIGS. 10a–10c are schematic views illustrating the manufacturing process of a surface-emitting type light-emitting device using an insulated substrate according to another embodiment of the present invention.

Referring to FIG. 10a, in this embodiment, on a first insulated sapphire substrate 160, there are serially epitaxially formed an n type GaN buffer layer 161, an n type AlGaN lower cladding layer 162, an InGaN active layer 163 which is of a conventional structure and can be of a single-quantum-well structure or a multiple-quantum-well structure, a p type AlGaN upper cladding layer 164 and a p type GaN ohmic contact layer 165.

Figure 10B:
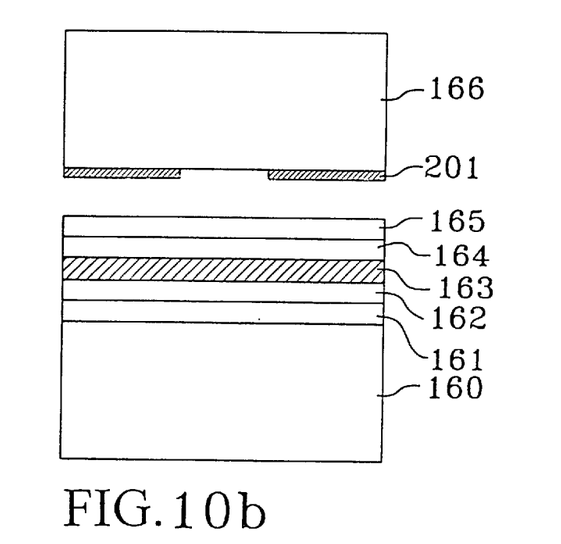
Figure 10C:
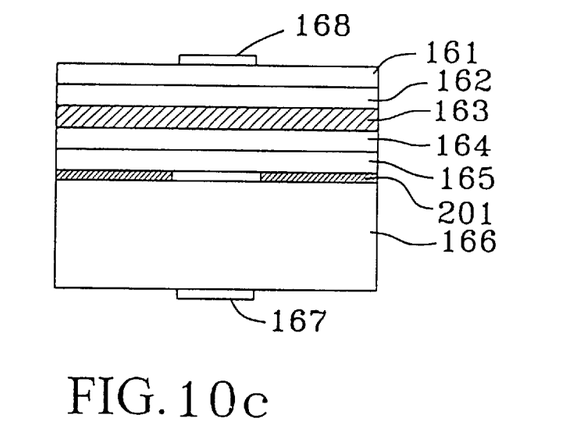

After the epitaxial process is finished, a metal reflection layer pattern 201 is coated on a p type second substrate 166, and then the metal reflection layer 201 is thermally combined with the ohmic contact layer 165, as illustrated in FIG. 10b. Subsequently, the first insulated sapphire substrate 160 is removed, and then a front electrode 168 and a rear electrode 167 are manufactured, so as to manufacture a gallium nitride-based light-emitting device with vertical type electrode structure, as illustrated in FIG. 10c.

The metal reflection layer 201 can form effective ohmic contact with the p type ohmic contact layer 165. The function of the ohmic contact and the function of the gap between the exposed p type second substrate 166 and the ohmic contact layer 165 are the same as that described in Embodiment 2.

The current distribution and the reflection of the light emitted from the active layer of this embodiment are the same as that of the Embodiment 1.

In the embodiments of the present invention, the reflection layer can be a single layer structure of titanium (Ti), aluminum (Al) or gold (Au) or a multiple layer structure of gold/germanium (Au/Ge), titanium/aluminum (Ti/Al) or nickel/gold (Ni/Au).

The material of the second substrate of the embodiments can be a compound semiconductor consisting of germanium (Ge) and silicon (Si), a compound semiconductor consisting of gallium phosphide (GaP) and indium phosphide (InP) or a conductive oxide such as indium-tin oxide (ITO) or zinc oxide (ZnO).

In other embodiments of the present invention, there is no active layer in the light-emitting device and light is emitted from the p-n junction between the upper cladding layer and the lower cladding layer.

In addition, in other embodiments of the present invention, the current-block region can made of an insulated oxide or an insulated nitride.

Furthermore, the electrode structure of the present invention can be of a lateral type if in a different embodiment the lateral type electrode structure is required.

The technical features and technical contents of the present invention have been fully disclosed as above. However, various modifications or replacements can be made by people skilled in the art based on the disclosure and teaching of the present invention without departing from the spirit of the present invention. Therefore, the scope of the present invention shall not be limited to the above disclosed embodiments and should include the modifications and replacements.

What is claimed is:

1. A light-emitting device comprising a semiconductor stack structure for generating light in response to a conduction of current;

a reflection layer provided on a main surface of said semiconductor stack structure for reflecting light generated from said stack structure and directed to said reflection layer, said reflection layer including at least one region with inferior conductivity functioning as a current-block region;

a thick layer positioned on said reflection layer and functioning as a substrate; and electrode structure for applying a current to said semiconductor stack structure.

2. The device as set forth in claim 1, wherein said current-block region includes a Schottky contact region including at least one of the following: insulated oxide, insulated nitride, and air.

3. The device as set forth in claim 1, wherein said reflection layer is a single layer structure including at least one of titanium (Ti), aluminum (Al) and gold (Au), or a multiple layer structure of gold/germanium (Au/Ge), titanium/aluminum (ti/Al) and nickel/gold (Ni/Au).

4. The device as set forth in claim 1, wherein said semiconductor stack structure comprises:

a lower cladding layer having a first conductive type;

an upper cladding layer having a second conductive type and being adjacent to said lower cladding layer; and an ohmic contact layer formed on said upper cladding layer.

5. The device as set forth in claim 4, wherein said semiconductor stack structure further comprises an active layer between said lower cladding layer and said upper cladding layer.

6. The device as set forth in claim 4, wherein said lower cladding layer is an n type AlGaInP semiconductor layer and said upper cladding layer is a p type AlGaInP semiconductor layer.

7. The device as set forth in claim 4, wherein said lower cladding layer is an n type gallium nitride-based III-V compound semiconductor layer and said upper cladding layer is a p type gallium nitride-based III-V compound semiconductor layer.

8. The device as set forth in claim 1, wherein the material of said thick layer includes at least one of the following: indium-tin oxide (ITO), zinc oxide (Zn)), a compound semiconductor consisting of germanium (Ge) and silicon (Si), and a compound semiconductor consisting of gallium phosphide (GaP) and indium phosphide (InP).

9. The device as set forth in claim 1, wherein said electrode structure comprises two electrodes positioned on the surface of said thick layer and the surface of the said stack structure opposite to said main surface, respectively.

* * * * *